United States Patent
Peng et al.

(10) Patent No.: US 9,602,154 B2
(45) Date of Patent: Mar. 21, 2017

(54) WIRELESS COMMUNICATION APPARATUS AND METHOD FOR IMPROVING SPECIFIC ABSORPTION RATIO THEREOF

(71) Applicant: Wistron NeWeb Corp., Hsinchu (TW)

(72) Inventors: Chen-Shu Peng, Hsinchu (TW); Yu-Meng Yen, Hsinchu (TW)

(73) Assignee: Wistron NeWeb Corp., Hsinchu (TW)

( * ) Notice: Subject to any disclaimer, the term of this patent is extended or adjusted under 35 U.S.C. 154(b) by 0 days.

(21) Appl. No.: 14/957,619

(22) Filed: Dec. 3, 2015

(65) Prior Publication Data

US 2017/0054464 A1    Feb. 23, 2017

(30) Foreign Application Priority Data

Aug. 18, 2015 (TW) .............................. 104126896 A

(51) Int. Cl.
 *H04B 1/02* (2006.01)
 *H04B 1/3827* (2015.01)
 *H04B 1/04* (2006.01)
 *H04B 1/66* (2006.01)

(52) U.S. Cl.
 CPC ............. *H04B 1/3838* (2013.01); *H04B 1/04* (2013.01); *H04B 2001/045* (2013.01)

(58) Field of Classification Search
 CPC ....... H04W 52/42; H01Q 3/24; H04B 7/0602; H04B 7/0608; H04B 7/0632; H04B 7/0686; H04B 7/0689; H04B 7/0693

USPC ......................................................... 455/101
See application file for complete search history.

(56) References Cited

U.S. PATENT DOCUMENTS

| 2004/0164803 A1* | 8/2004 | Canyon ................. H03F 1/0211 330/285 |
| 2004/0166909 A1* | 8/2004 | Lee ......................... H04B 1/005 455/575.7 |
| 2012/0002630 A1* | 1/2012 | Bergman ............... H04B 7/061 370/329 |

* cited by examiner

*Primary Examiner* — Lee Nguyen
(74) *Attorney, Agent, or Firm* — Jianq Chyun IP Office

(57) ABSTRACT

A wireless communication apparatus and a method for improving specific absorption ration thereof are provided. The method includes following steps. A first signal quality parameter of a first antenna and a second signal quality parameter of a second antenna are obtained. A first amplifier character parameter of a power amplifier while the power amplifier is connected to the first antenna is predicted, and a second amplifier character parameter of the power amplifier while the power amplifier is connected to the second antenna is predicted. The first antenna or the second antenna is selected to transmit a RF transmission signal according to the first amplifier character parameter, the first signal quality parameter, the second amplifier character parameter and the second signal quality parameter.

11 Claims, 5 Drawing Sheets

WIRELESS COMMUNICATION APPARATUS AND METHOD FOR IMPROVING SPECIFIC ABSORPTION RATIO THEREOF

CROSS-REFERENCE TO RELATED APPLICATION

This application claims the priority benefit of Taiwan application serial no. 104126896, filed on Aug. 18, 2015. The entirety of the above-mentioned patent application is hereby incorporated by reference herein and made a part of this specification.

BACKGROUND OF THE INVENTION

Field of the Invention

The invention relates to an electronic apparatus and an operation method thereof, and particularly relates to a wireless communication apparatus and a method for improving a specific absorption ratio thereof.

Description of Related Art

Along with advance and development of wireless communication technology, mobile wireless communication apparatuses have been widely used in people's daily life. Each of the mobile wireless communication apparatuses has an antenna for transmitting and receiving wireless signals, though electromagnetic waves emitted by the antenna may be harmful to human health. Therefore, federal communications commission (FCC) specifies a specific absorption ratio (SAR) of the mobile wireless communication apparatuses, so as to limit radiated energy or a maximum of the amount of radiation of the mobile wireless communication apparatuses to avoid the electromagnetic waves emitted by the antenna from jeopardizing human health. The SAR refers to electromagnetic wave energy absorbed by unit mass within a unit time. In other words, the higher the SAR is, the greater the electromagnetic waves emitted by the antenna do harm to human body.

However, in order to make the SAR to be complied with a test specification, most of the conventional wireless communication apparatuses just reduce a total radiation power, so as to maintain the SAR within a safe test range. However, along with decrease of the total radiation power, a transmission distance of the electromagnetic wave is accordingly decreased, which influences the communication quality of the electronic apparatus. Alternatively, the conventional mobile wireless communication apparatus may change a structure of the antenna to make the SAR to be lower than the specification, though such method probably occupies a larger volume. Alternatively, the conventional mobile wireless communication apparatus may decrease the SAR by adding an extra circuit, though such method is liable to decrease a whole performance of the antenna or cause interference. Therefore, how to satisfy the safety specified by the SAR while considering the communication quality of the mobile wireless communication apparatus has become a major problem faced in design of the mobile wireless communication apparatus.

SUMMARY OF THE INVENTION

The invention is directed to a wireless communication apparatus and a method for improving a specific absorption ratio (SAR) thereof, which are capable of decreasing the SAR of the wireless communication apparatus by switching transmitting antennas.

An embodiment of the invention provides a wireless communication apparatus including a first antenna, a second antenna, a power amplifier, a switching circuit and a control circuit. The power amplifier amplifies and outputs a radio frequency transmission signal. The switching circuit is coupled to the first antenna, the second antenna and the power amplifier, and selects to connect the power amplifier to the first antenna or the second antenna. The control circuit is coupled to the input end of the power amplifier and the switching circuit, and predicts a first amplifier character parameter corresponding to the power amplifier while the power amplifier is connected to the first antenna, and predicts a second amplifier character parameter corresponding to the power amplifier while the power amplifier is connected to the second antenna. The control circuit controls the switching circuit to connect the power amplifier to the first antenna or the second antenna according to the first amplifier character parameter, a first signal quality parameter of the first antenna, the second amplifier character parameter and a second signal quality parameter of the second antenna, so as to select the first antenna or the second antenna to transmit the radio frequency transmission signal.

Another embodiment of the invention provides a method for improving a specific absorption ratio, which includes following steps. A first signal quality parameter of a first antenna and a second signal quality parameter of a second antenna are detected. A first amplifier character parameter of a power amplifier while the power amplifier is connected to the first antenna is predicted, and a second amplifier character parameter of the power amplifier while the power amplifier is connected to the second antenna is predicted. The first antenna or the second antenna is selected to transmit a radio frequency transmission signal according to the first amplifier character parameter, the first signal quality parameter of the first antenna, the second amplifier character parameter and the second signal quality parameter of the second antenna.

According to the above descriptions, in the aforementioned embodiments of the invention, a wireless communication apparatus and a method for improving a specific absorption ratio thereof are provided, in which the antenna used for transmitting the radio frequency transmission signal is selected according to the signal quality parameters respectively corresponding to a plurality of antennas and the amplifier character parameters obtained when the power amplifier is connected to each of the antennas. Moreover, after the antenna used for transmitting the radio frequency transmission signal is selected, the amplifier character parameter of the power amplifier can be further optimized. In this way, in case that the operation performance of the wireless communication device is not influenced, the SAR of the wireless communication device is complied with a test specification.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
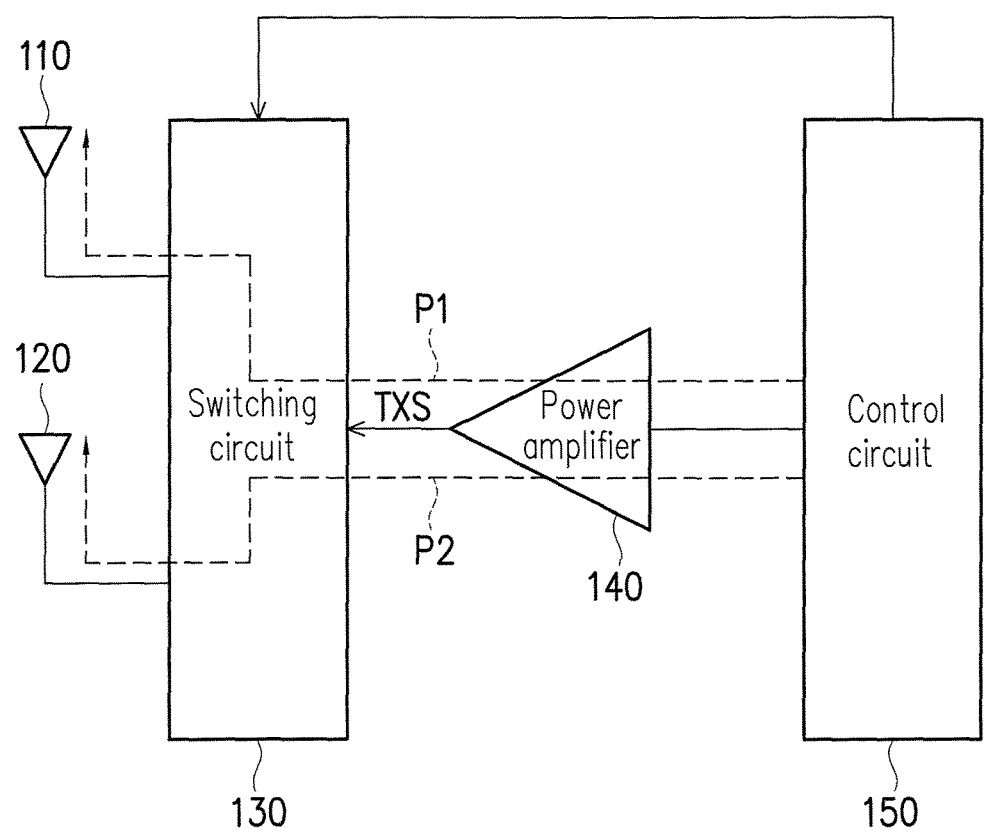
FIG. 1 is a schematic diagram of a wireless communication apparatus according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic diagram of a wireless communication apparatus according to an embodiment of the invention. As shown in FIG. 1, the wireless communication apparatus 10 includes a first antenna 110, a second antenna 120, a power amplifier 140, a switching circuit 130 and a control circuit 150. In an embodiment, the wireless communication apparatus 10 is, for example, an electronic apparatus having a radio frequency (RF) circuit such as a mobile phone, a personal digital assistant or a notebook computer, etc., and can transmit or receive RF signals through the first antenna 110 and the second antenna 120. Moreover, during a process of establishing the RF transmission, the wireless communication apparatus 10 may select the first antenna 110 or the second antenna 120 to transmit a RF transmission signal TXS, so as to improve a specific absorption ratio (SAR) of the wireless communication apparatus 10 by switching an antenna transmission path.

The first antenna 110 and the second antenna 120 operate in proper frequency bands according to a communication standard of the wireless communication apparatus 10. For example, the operation frequency bands of the first antenna 110 and the second antenna 120 of the wireless communication apparatus 10 are designed to transceive RF signals of a long term evolution (LTE) system, a worldwide interoperability for microwave access (WiMAX) system, a digital television broadcasting (DTV) system, a global positioning system (GPS), a wireless wide area network (WWAN) system, a wireless local area network (WLAN) system, an ultra-wideband (UWB) system, a wireless personal area network (WPAN) system or other wireless or mobile communication frequency band applications, which is not limited by the invention.

The switching circuit 130 selects to connect the first antenna 110 or the second antenna 120 to an output terminal of the power amplifier 140. In other words, the switching circuit 130 may connect the first antenna 110 to the output terminal of the power amplifier 140, and the switching circuit 130 may also connect the second antenna 120 to the output terminal of the power amplifier 140. The switching circuit 130 can be a switch, a multiplexer, a logic circuit or a combination thereof, which is not limited by the invention. In brief, when the switching circuit 130 selects to connect the first antenna 110 to the power amplifier 140, the wireless communication apparatus 10 may transmit the RF transmission signal TXS through the first antenna 110. When the switching circuit 130 selects to connect the second antenna 120 to the power amplifier 140, the wireless communication apparatus 10 may transmit the RF transmission signal TXS through the second antenna 120.

The power amplifier 140 may amplify a signal output by the control circuit 150, such that the first antenna 110 or the second antenna 120 may transmit the amplified RF transmission signal TXS. It should be noted that the power amplifier 140 may have different performance characters when the power amplifier 140 operates in different circuit environments. Therefore, in order to maintain an output power of the power amplifier 140, the power amplifier 140 may have different amplifier character parameters in response to a variation of a circuit coupling relationship or a variation of the input signal. For example, the control circuit 150 may detect the output signal of the power amplifier 140 to determine whether to adjust the amplifier character parameter of the power amplifier 140. The amplifier character parameter is, for example, a controllable factor capable of determining the output power of the power amplifier 140, such as a working bias and a static current value, etc., of the power amplifier 140. The control circuit 150 is a combination of a digital circuit and an analog circuit, and may include a RF transceiver, a baseband processor and a memory. The control circuit 150 may control a connection status of the switching circuit 130, and may determine an operation mode of the power amplifier 140 to accordingly determine and adjust the amplifier character parameter of the power amplifier 140. For example, the control circuit 150 may determine the operation mode of the power amplifier 140 according to an operation frequency or a signal modulation mode, though the invention is not limited thereto.

Figure 2:
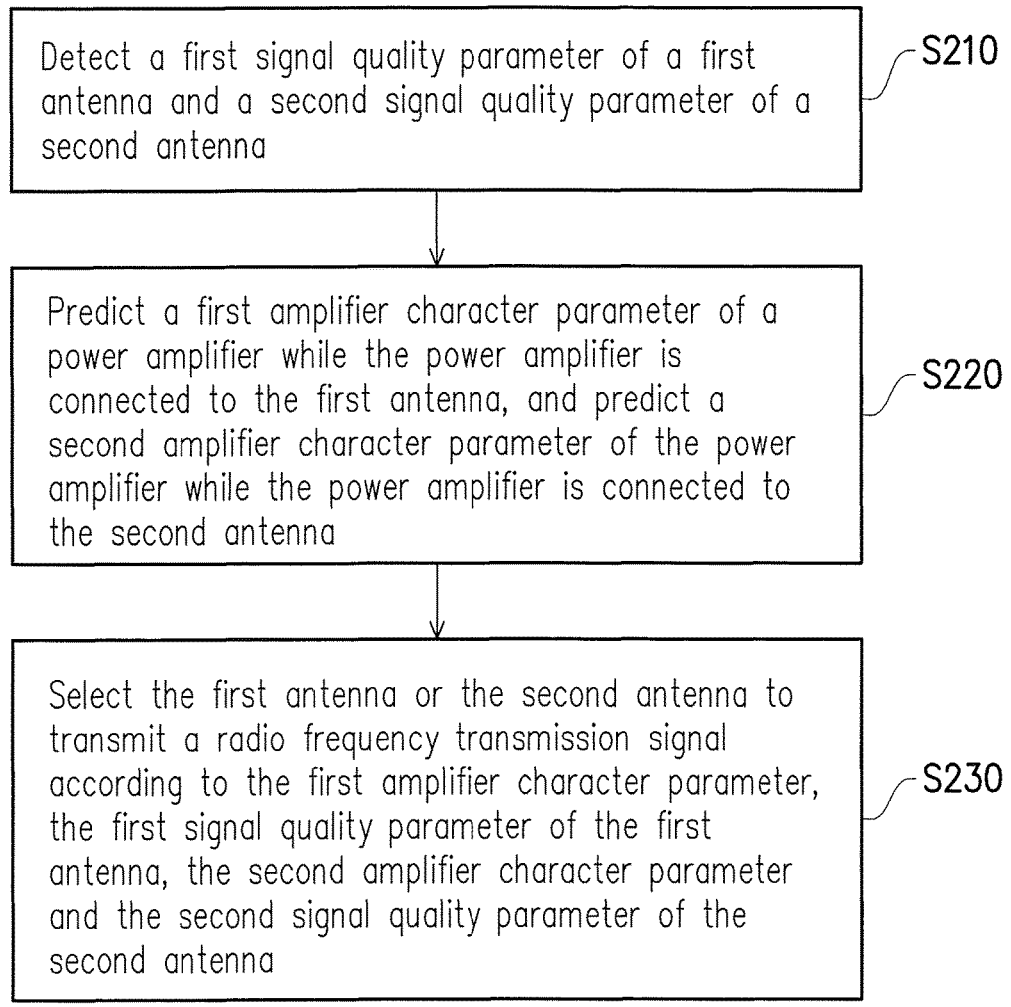
FIG. 2 is a flowchart illustrating a method for improving a specific absorption ratio (SAR) according to an embodiment of the invention.

FIG. 2 is a flowchart illustrating a method for improving a specific absorption ratio (SAR) according to an embodiment of the invention, and the operation of the wireless communication apparatus 10 is described below with reference of FIG. 1 and FIG. 2. In step S210, the control circuit 150 detects a first signal quality parameter of the first antenna 110 and a second signal quality parameter of the second antenna 120. In detail, when the control circuit 150 receives external RF signals respectively through the first antenna 110 and the second antenna 120, the control circuit 150 may detect the first signal quality parameter according to a signal performance character of the RF signal received by the first antenna 110. Similarly, the control circuit 150 may also detect the second signal quality parameter according to a signal performance character of the RF signal received by the second antenna 120. The first signal quality parameter and the second signal quality parameter are, for example, measurement values or estimation values capable of presenting a RF signal receiving status such as received signal strength indicators (RSSI) or signal to noise ratios (SNR), etc., which is not limited by the invention.

In step S220, the control circuit 150 predicts a first amplifier character parameter of the power amplifier 140 while the power amplifier 140 is connected to the first antenna 110, and predicts a second amplifier character parameter of the power amplifier 140 while the power amplifier 140 is connected to the second antenna 120. In other words, the power amplifier 140 may have different first amplifier character parameter and second amplifier character parameter in response to situations of being connected to the first antenna 110 or the second antenna 120. In an embodiment, the control circuit 150 may predict the first amplifier character parameter and the second amplifier character parameter through a table look-up manner, and a character parameter table of the power amplifier 140 can be recorded in the memory of the control circuit 150. The character parameter table is pre-produced by testing and calibrating the power amplifier 140. However, it should be noted that based on a design and specification of the power amplifier 140, the control circuit 150 may determine or adjust the first amplifier character parameter and the second amplifier character parameter of the power amplifier 140 according to a specific method, which is not limited by the invention.

In step S230, the control circuit 150 selects the first antenna 110 or the second antenna 120 to transmit the RF transmission signal TXS according to the first amplifier character parameter, the first signal quality parameter of the first antenna 110, the second amplifier character parameter and the second signal quality parameter of the second antenna 120. In other words, the control circuit 150 may select to use an antenna transmission path P1 or an antenna transmission path P2 to transmit the RF transmission signal TXS. In this way, compared with the fixed coupling relationship between a plurality of antennas and the corresponding power amplifiers thereof, in the invention, the SAR of the wireless communication apparatus can be improved by switching the antenna transmission path.

Figure 3:
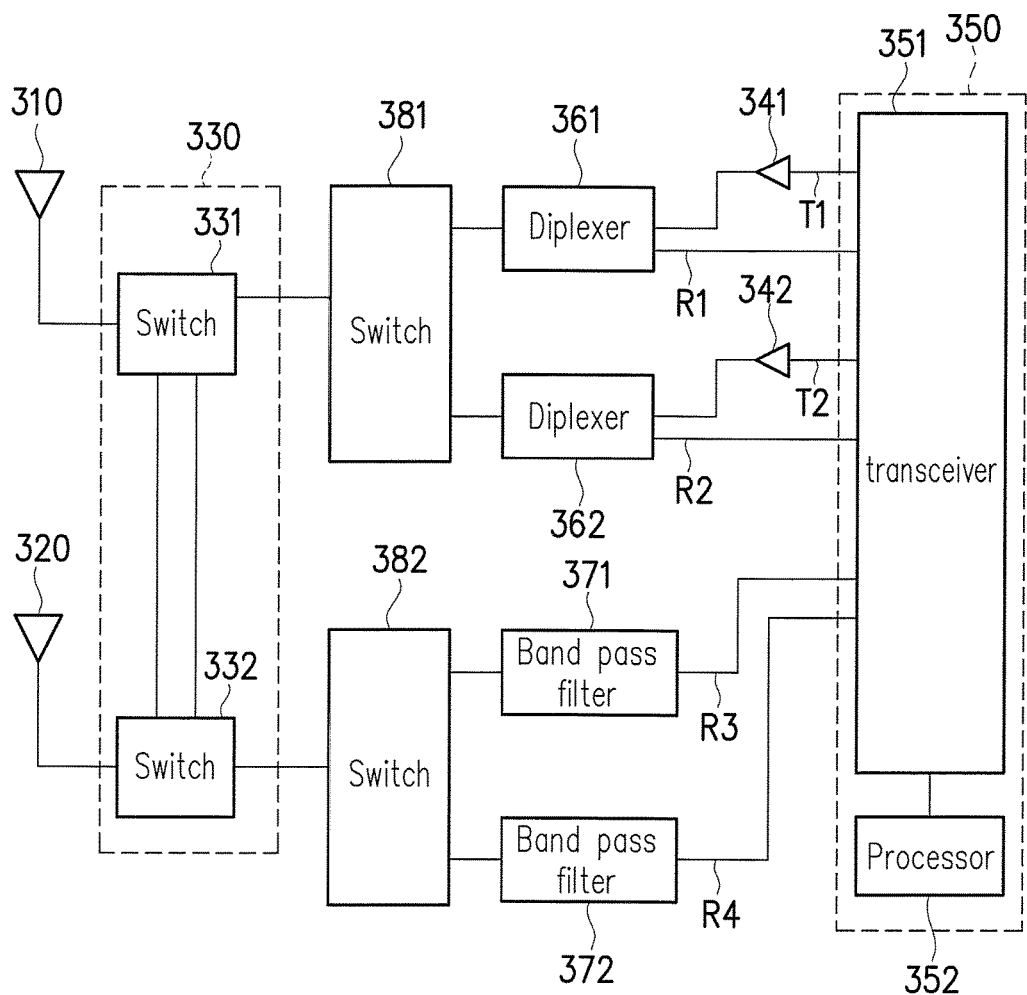
FIG. 3 is a schematic diagram of a wireless communication apparatus according to another embodiment of the invention.

FIG. 3 is a schematic diagram of a wireless communication apparatus according to another embodiment of the invention. Referring to FIG. 3, the wireless communication apparatus 30 includes a first antenna 310, a second antenna 320, a switching circuit 330, a switch 381, a switch 382, a diplexer 361, a diplexer 362, a band pass filter 371, a band pass filter 372, a power amplifier 341, a power amplifier 342 and a control circuit 350.

In the present embodiment, the control circuit 350 includes a transceiver 351 and a processor 352. The transceiver 351, for example, includes a digital-to-analog converter, an analog-to-digital converter, a low noise amplifier, an impedance matching circuit, a frequency mixer, a frequency up-converter, a frequency down-converter, a filter, etc. The processor 352 processes digital signals and may execute the method for improving the SAR of the invention. Moreover, the processor 352 can be built with a memory or coupled to an external memory for accessing program codes, a codebook, or buffered or permanent data. The processor 352 can also be implemented by hardware, software or a combination thereof.

The switching circuit 330 includes a switch 331 and a switch 332. The first antenna 310 is coupled to the switch 331, and the second antenna 320 is coupled to the switch 332. The switch 331 and the switch 332 are coupled to each other and are respectively connected to the switch 381 and the switch 382. The switch 331 and the switch 332 are configured to connect the first antenna 310 to the switch 381 or the switch 382 according to the control of the processor 352. Similarly, the switch 331 and the switch 332 are configured to connect the second antenna 320 to the switch 381 or the switch 382 according to the control of the processor 352.

The switch 381 is coupled to the diplexers 361 and 362. In the present embodiment, when the wireless communication apparatus 30 operates in a first frequency band, the switch 381 switches a RF circuit path of the wireless communication apparatus 30, such that the transceiver 351 transceives RF signals corresponding to the first frequency band through a transmission path T1 and a receiving path R1. Conversely, when the wireless communication apparatus 30 operates in a second frequency band, the switch 381 switches the RF circuit path of the wireless communication apparatus 30, such that the transceiver 351 transceives RF signals corresponding to the second frequency band through a transmission path T2 and a receiving path R2.

The diplexer 361 is coupled to the transceiver 351 through the transmission path T1 and the receiving path R1, and the diplexer 362 is coupled to the transceiver 351 through the transmission path T2 and the receiving path R2. The diplexers 361 and 362 can respectively transmit the RF transmission signals coming from the power amplifiers 341 and 342 to the switch 381, and can transmit a RF receiving signal received through the first antenna 310 or the second antenna 320 to the transceiver 351. In the present embodiment, the power amplifier 341 and the power amplifier 342 are respectively disposed on the transmission path T1 and the transmission path T2. The power amplifier 341 and the power amplifier 342 amplify a RF transmission signal up-converted by the transceiver 351.

On the other hand, the switch 382 is coupled to the band pass filters 371 and 372, and the band pass filters 371 and 372 are coupled to the transceiver 351. When the wireless communication apparatus 30 operates in the first frequency band, the switch 382 switches the RF circuit path of the wireless communication apparatus 30, such that the transceiver 351 receives a RF receiving signal corresponding to the first frequency band through a receiving path R3. Conversely, when the wireless communication apparatus 30 operates in the second frequency band, the switch 382 switches the RF circuit path of the wireless communication apparatus 30, such that the transceiver 351 receives a RF receiving signal corresponding to the second frequency band through a receiving path R4.

In the present embodiment, when the wireless communication apparatus 30 operates in the first frequency band, the RF transmission signal output by the power amplifier 341 can be transmitted through the first antenna 310 or the second antenna 320 selected by the processor 352. Similarly, when the wireless communication apparatus 30 operates in the second frequency band, the RF transmission signal output by the power amplifier 342 can be transmitted through the first antenna 310 or the second antenna 320 selected by the processor 352. The processor 352 selects the antenna according to amplifier characters of the power amplifiers 341 and 342 and quality of the received signal. Moreover, in an embodiment, when one of the first antenna 310 and the second antenna 320 is selected to transmit the RF transmission signal, the other one of the first antenna 310 and the second antenna 320 can be simultaneously used to receive the RF receiving signal, though the invention is not limited thereto.

Figure 4:
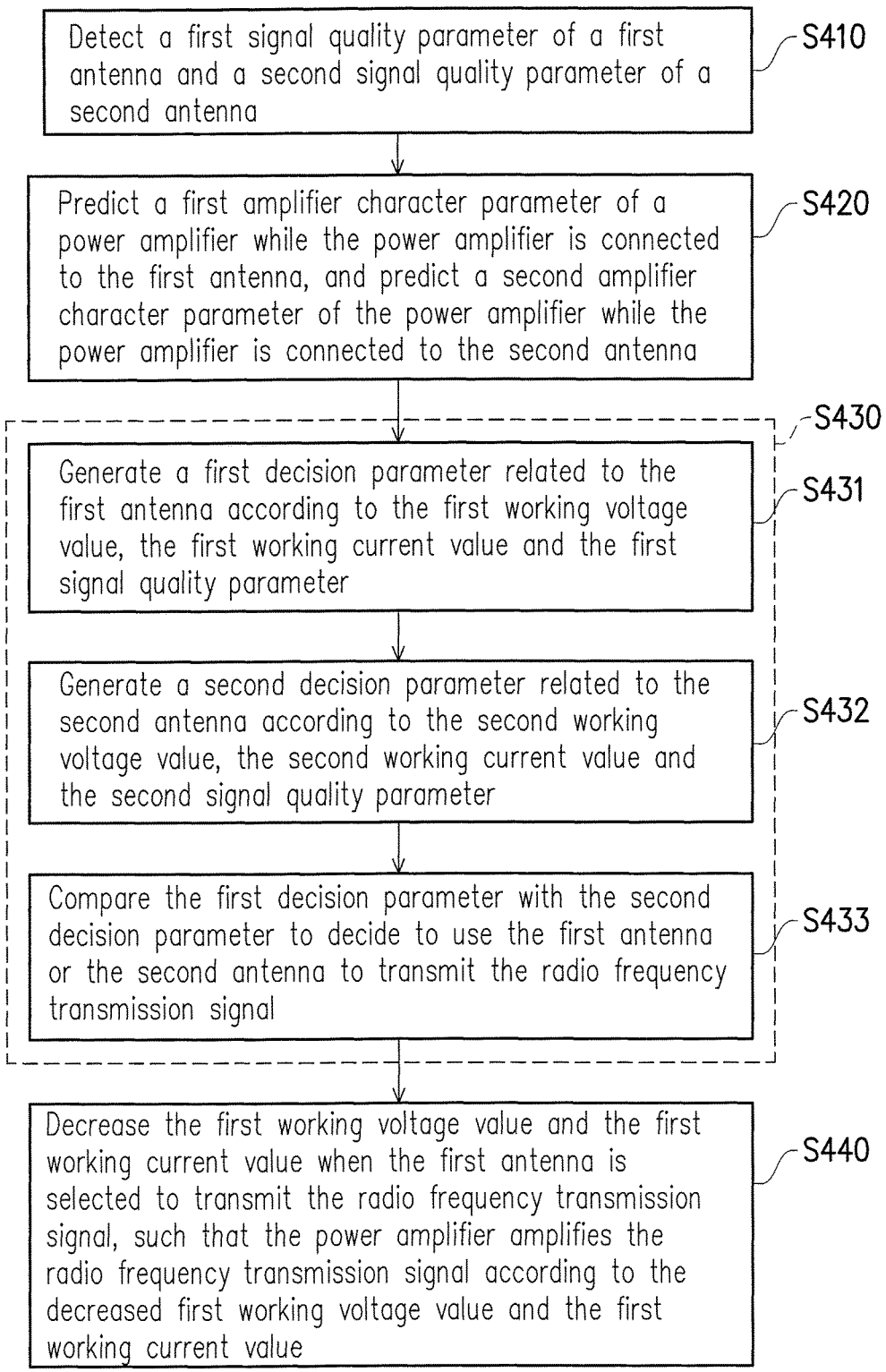
FIG. 4 is a flowchart illustrating a method for improving the SAR according to another embodiment of the invention

FIG. 4 is a flowchart illustrating a method for improving the SAR according to another embodiment of the invention, and the operation of the wireless communication apparatus 30 is described below with reference of FIG. 3 and FIG. 4. In step S410, the processor 352 detects a first signal quality parameter of the first antenna 310 and a second signal quality parameter of the second antenna 320. For example, the processor 352 of the control circuit 350 periodically detects a first RSSI corresponding to the first antenna 310 and a second RSSI corresponding to the second antenna 320 according to a predetermined period, and takes the first RSSI as the first signal quality parameter and takes the second RSSI as the second signal quality parameter. The aforementioned predetermined period is, for example, 10 ms, 15 ms or other period length, which is not limited by the invention.

In step S420, the processor 352 predicts a first amplifier character parameter of the power amplifiers 341, 342 while the power amplifiers 341 and 342 are connected to the first antenna 310, and predicts a second amplifier character parameter of the power amplifiers 341, 342 while the power amplifiers 341, 342 are connected to the second antenna 320. The first amplifier character parameter and the second amplifier character parameter can be recorded in a table look-up manner in a memory in internal of the control circuit 350 or other memory location. In other words, a character parameter table recording the first amplifier character parameter and the second amplifier character parameter is stored in a memory. In the present embodiment, the first amplifier character parameter includes a first working voltage value and a first working current value, and the second amplifier character parameter includes a second working voltage value and a second working current value. For example, the first working voltage value and the second working voltage value can be working biases of the power amplifiers 341 and 342, and the first working current value and the second working current value can be static current values of the power amplifiers 341 and 342. In an embodiment, the control circuit 350 may inquire the character parameter tables of the power amplifiers 341, 342 according to a target output power of the power amplifiers 341, 342, so as to predict the first working voltage value, the first working current value, the second working voltage value and the second working current value.

In step S430, the processor 352 of the control circuit 350 selects the first antenna 310 or the second antenna 320 to transmit the RF transmission signal according to the first amplifier character parameter, the first signal quality parameter of the first antenna 310, the second amplifier character parameter and the second signal quality parameter of the second antenna 320. For example, in view of detailed steps of the step S430, in step S431, the processor 352 may generate a first decision parameter related to the first antenna 310 according to the first working voltage value, the first working current value and the first signal quality parameter. In step S432, the processor 352 generates a second decision parameter related to the second antenna 320 according to the second working voltage value, the second working current value and the second signal quality parameter.

To be specific, the processor 352 may input the first working voltage value, the first working current value and the first signal quality parameter into a relationship equation to generate the first decision parameter. Similarly, the processor 352 may also input the second working voltage value, the second working current value and the second signal quality parameter into the relationship equation to generate the second decision parameter. For example, the first decision parameter can be a product of the first working voltage value, the first working current value and the first signal quality parameter, and the second decision parameter can be a product of the second working voltage value, the second working current value and the second signal quality parameter.

In step S433, the processor 352 compares the first decision parameter with the second decision parameter to decide to use the first antenna or the second antenna to transmit the RF transmission signal. For example, when the first decision parameter is greater than the second decision parameter, the processor 352 may select the first antenna 310 to transmit the RF transmission signal.

As shown in step S440, when the first antenna 310 is selected to transmit the RF transmission signal, the processor 352 further decreases the first working voltage value and the first working current value, such that the power amplifiers 341, 342 amplify the RF transmission signal according to the decreased first working voltage value and first working current value. Namely, after the processor 352 selects the antenna transmission path, the processor 352 further fine tunes the first working voltage value and the first working current value of the power amplifiers 341, 342 while the power amplifiers 341, 342 are connected to the first antenna 310. In this way, by executing the step S440, the SAR of the wireless communication apparatus 30 can be further decreased.

However, in the present embodiment, although a situation that the first working voltage value and the first working current value are simultaneously decreased is taken as an example for description, the invention is not limited thereto. In an embodiment, the processor 352 may only decrease one of the first working voltage value and the first working current value. Moreover, in the embodiment of FIG. 3 and FIG. 4, although a situation that the wireless communication apparatus 30 operates in the first frequency band and the second frequency band is taken as an example for description, the invention is not limited thereto. In an embodiment, the wireless communication apparatus 30 may operate in two or more frequency bands and have more transmission paths, and accordingly include more number of the power amplifiers and diplexers.

Figure 5:
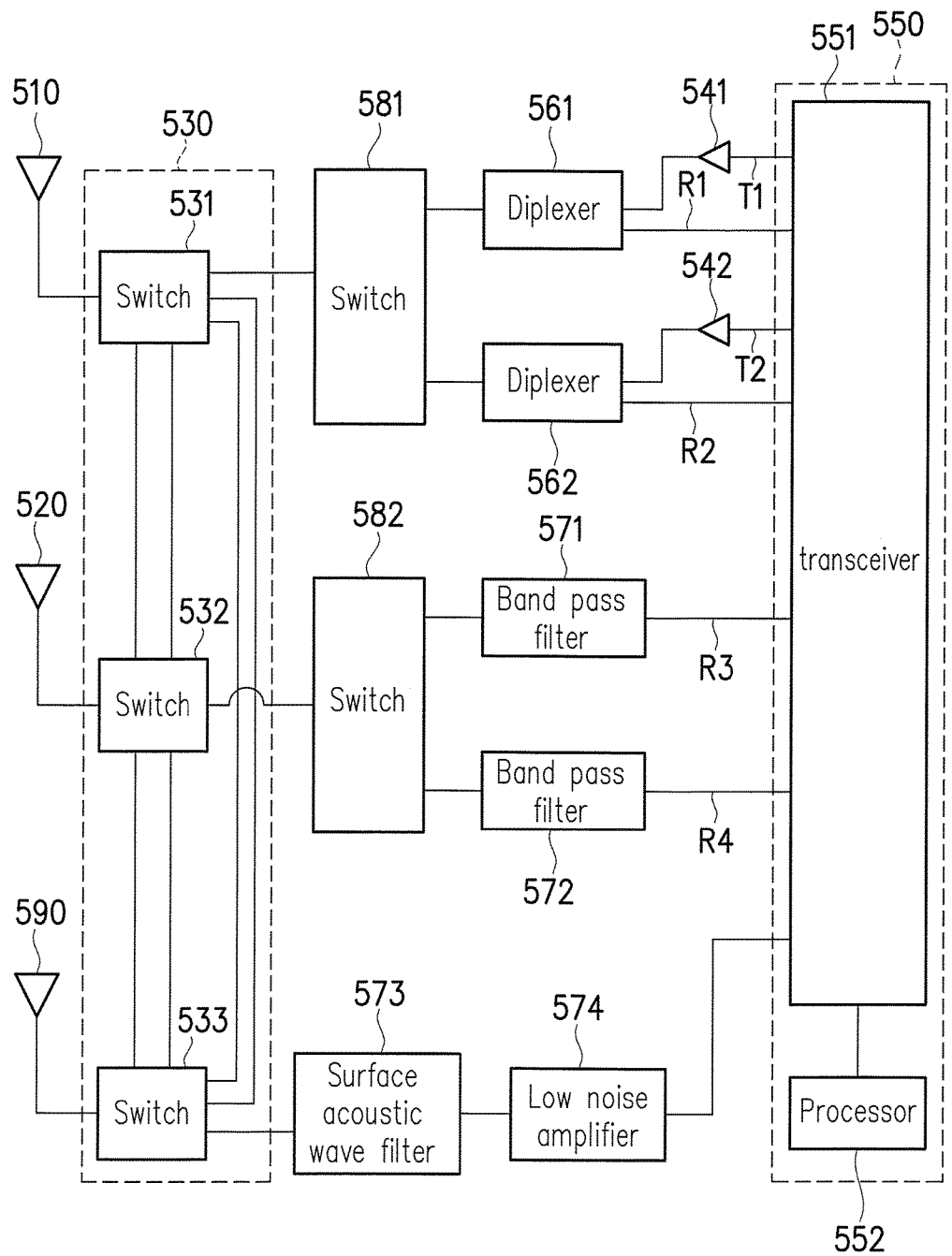
FIG. 5 is a schematic diagram of a wireless communication apparatus according to still another embodiment of the invention.

The embodiments of FIG. 1 and FIG. 3 mainly provide operations of the wireless communication apparatus for transmitting the RF transmission signal through double antennas, though the invention is not limited thereto. For example, FIG. 5 is a schematic diagram of a wireless communication apparatus according to an embodiment of the invention. In the embodiment of FIG. 5, the wireless communication apparatus 50 includes a first antenna 510, a second antenna 520, a switching circuit 530, a switch 581, a switch 582, a diplexer 561, a duplexer 562, a band pass filter 571, a band pass filter 572, a power amplifier 541, a power amplifier 542 and a control circuit 550. The control circuit 550 includes a transceiver 551 and a processor 552 coupling relations and functions of the above components are similar to that of the embodiment of FIG. 3, and a detailed description thereof is not repeated.

Different to the embodiment of FIG. 3, the wireless communication apparatus 50 further includes a third antenna 590, a surface acoustic wave filter (SAW filter) 573, a low noise amplifier (LNA) 574, and the switching circuit 530 includes a switch 531, a switch 532 and a switch 533 coupled to the third antenna 590. For example, when the first antenna 510 and the second antenna 520 are respectively a main antenna and an auxiliary antenna supporting a long term evolution (LTE) system, the third antenna 590 can be an antenna supporting a GPS function, though the invention is not limited thereto.

In the present embodiment, when the wireless communication apparatus 50 operates in the first frequency band, the processor 552 may control the switches 531, 532, 533 to transmit a RF transmission signal output by the power amplifier 541 to the first antenna 510, the second antenna 520 or the third antenna 530. Similarly, when the wireless communication apparatus 50 operates in the second frequency band, the processor 552 may control the switches 531, 532, 533 to transmit a RF transmission signal output by the power amplifier 542 to the first antenna 510, the second antenna 520 or the third antenna 530. In this way, since the wireless communication apparatus 50 selects the antenna to transmit the RF transmission signal according to the amplifier character parameters of the power amplifiers 541, 542 and the signal receiving quality of the first antenna 510, the second antenna 520 or the third antenna 530, the SAR of the wireless communication apparatus 50 can be improved through switching of the antennas.

For example, when the wireless communication apparatus 50 operates in a BAND 3 (with an uplink frequency band between 1710 MHz-1785 MHz, and a downlink frequency band between 1805 MHz-1850 MHz) of the LTE system, the wireless communication apparatus 50 may transmit the RF transmission signal (an uplink signal) through the transmission path T1 and receive RF receiving signals (downlink signals) through receiving paths R1 and R3. A first RSSI of the first antenna 510 is S1 (dbm), a first working voltage value is V1 (volt), and a first working current value is I1 (mA), the processor 522 may obtain a first decision parameter D1 according to the following equation (1):

$$D1 = S1 \times V1 \times I1 \qquad \text{equation (1)}$$

A second RSSI of the second antenna 520 is S2 (dbm), a second working voltage value is V2 (volt), and a second working current value is I2 (mA), the processor 522 may obtain a second decision parameter D2 according to the following equation (2):

$$D2 = S2 \times V2 \times I2 \qquad \text{equation (2)}$$

Similarly, a third RSSI of the third antenna 530 is S3 (dbm), a third working voltage value is V3 (volt), and a third working current value is I3 (mA), the processor 522 may obtain a third decision parameter D3 according to the following equation (3):

$$D3 = S3 \times V3 \times I3 \qquad \text{equation (3)}$$

In the present exemplary embodiment, it is assumed that the processor 552 determines that D2>D1>D3, the processor 552 then controls the switching circuit 530 to connect the second antenna 520 to the switch 581, such that the RF transmission signal output by the power amplifier 542 can be transmitted through the second antenna 520. Compared with the conventional configuration method that the power amplifier on the signal transmission path can only transmit the RF transmission signal to the fixed antenna, the wireless communication apparatus 50 may decrease the SAR of the wireless communication apparatus 50 by switching the antennas.

In summary, the antenna used for transmitting the RF transmission signal is selected according to the signal quality parameters respectively corresponding to a plurality of antennas and the amplifier character parameters obtained when the power amplifier is connected to each of the antennas, so as to improve the SAR by elastically switching the antennas. The power amplifier may have different amplifier character parameters when it is connected to different antennas. In this way, in case that the operation performance of the wireless communication device is not influenced, the SAR of the wireless communication device is complied with a test specification. Moreover, when the most suitable antenna used for transmitting the RF transmission signal is selected, the amplifier character parameter corresponding to the power amplifier while the power amplifier is connected to the most suitable antenna can be further adjusted, so as to further decrease the SAR. In other words, in the invention, the SAR can be complied with the test specification in case that the signal receiving quality of the antenna and the operation performance of the wireless communication apparatus are not influenced, which avails improving the communication quality of the electronic apparatus.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A wireless communication apparatus, comprising:
   a first antenna;
   a second antenna;
   a power amplifier, amplifying and outputting a radio frequency transmission signal;
   a switching circuit, coupled to the first antenna, the second antenna and the power amplifier, and selecting to connect the power amplifier to the first antenna or the second antenna; and
   a control circuit, coupled to the power amplifier and the switching circuit, and predicting a first amplifier character parameter corresponding to the power amplifier while the power amplifier is connected to the first antenna, and predicting a second amplifier character parameter corresponding to the power amplifier while the power amplifier is connected to the second antenna,
   wherein the control circuit controls the switching circuit to connect the power amplifier to the first antenna or the second antenna according to the first amplifier character parameter, a first signal quality parameter of the first antenna, the second amplifier character parameter and a second signal quality parameter of the second antenna, so as to select the first antenna or the second antenna to transmit the radio frequency transmission signal,
   wherein the first amplifier character parameter comprises a first working voltage value and a first working current value, and the second amplifier character parameter comprises a second working voltage value and a second working current value,
   wherein the control circuit generates a first decision parameter related to the first antenna according to the first working voltage value, the first working current value and the first signal quality parameter, and the control circuit generates a second decision parameter related to the second antenna according to the second working voltage value, the second working current value and the second signal quality parameter, and the control circuit compares the first decision parameter with the second decision parameter to decide to use the first antenna or the second antenna to transmit the radio frequency transmission signal.

2. The wireless communication apparatus as claimed in claim 1, wherein the control circuit inquires a character parameter table of the power amplifier according to a target output power of the power amplifier, so as to predict the first working voltage value, the first working current value, the second working voltage value and the second working current value, and the characteristic parameter table is stored in a memory.

3. The wireless communication apparatus as claimed in claim 1, wherein when the control circuit controls the switching circuit to connect the power amplifier to the first antenna, the control circuit decreases the first working voltage value, such that the power amplifier amplifies the radio frequency transmission signal according to the decreased first working voltage value.

4. The wireless communication apparatus as claimed in claim 1, wherein when the control circuit controls the switching circuit to connect the power amplifier to the first antenna, the control circuit decreases the first working current value, such that the power amplifier amplifies the radio frequency transmission signal according to the decreased first working current value.

5. The wireless communication apparatus as claimed in claim 1, wherein the first decision parameter is a product of the first working voltage value, the first working current value and the first signal quality parameter, and the second decision parameter is a product of the second working voltage value, the second working current value and the second signal quality parameter.

6. The wireless communication apparatus as claimed in claim 1, wherein the control circuit periodically detects a first received signal strength indicator corresponding to the first antenna and a second received signal strength indicator corresponding to the second antenna according to a predetermined period, and takes the first received signal strength indicator as the first signal quality parameter and takes the second received signal strength indicator as the second signal quality parameter.

7. A method for improving a specific absorption ratio, comprising:
   detecting a first signal quality parameter of a first antenna and a second signal quality parameter of a second antenna;
   predicting a first amplifier character parameter of a power amplifier while the power amplifier is connected to the first antenna, and predicting a second amplifier character parameter of the power amplifier while the power amplifier is connected to the second antenna; and
   selecting the first antenna or the second antenna to transmit a radio frequency transmission signal according to the first amplifier character parameter, the first signal quality parameter, the second amplifier character parameter and the second signal quality parameter,
   wherein the first amplifier character parameter comprises a first working voltage value and a first working current value, and the second amplifier character parameter comprises a second working voltage value and a second working current value,
   wherein the step of selecting the first antenna or the second antenna to transmit the radio frequency transmission signal according to the first amplifier character parameter, the first signal quality parameter, the second amplifier character parameter and the second signal quality parameter comprises:
   generating a first decision parameter related to the first antenna according to the first working voltage value, the first working current value and the first signal quality parameter;
   generating a second decision parameter related to the second antenna according to the second working voltage value, the second working current value and the second signal quality parameter; and
   comparing the first decision parameter with the second decision parameter to decide to use the first antenna or the second antenna to transmit the radio frequency transmission signal.

8. The method for improving the specific absorption ratio as claimed in claim 7, further comprising:
   inquiring a character parameter table of the power amplifier according to a target output power of the power amplifier, so as to predict the first working voltage value, the first working current value, the second working voltage value and the second working current value.

9. The method for improving the specific absorption ratio as claimed in claim 7, further comprising:
   decreasing the first working voltage value and the first working current value or one of the first working voltage value and the first working current value when the first antenna is selected to transmit the radio frequency transmission signal, such that the power amplifier amplifies the radio frequency transmission signal according to the decreased first working voltage value and the first working current value.

10. The method for improving the specific absorption ratio as claimed in claim 7, wherein the first decision parameter is a product of the first working voltage value, the first working current value and the first signal quality parameter, and the second decision parameter is a product of the second working voltage value, the second working current value and the second signal quality parameter.

11. The method for improving the specific absorption ratio as claimed in claim 7, wherein the step of detecting the first signal quality parameter of the first antenna and the second signal quality parameter of the second antenna comprises:
   periodically detecting a first received signal strength indicator corresponding to the first antenna and a second received signal strength indicator corresponding to the second antenna according to a predetermined period, and taking the first received signal strength indicator as the first signal quality parameter and taking the second received signal strength indicator as the second signal quality parameter.

* * * * *